May 26, 1970 C. H. FA 3,514,676

INSULATED GATE COMPLEMENTARY FIELD EFFECT TRANSISTORS GATE STRUCTURE

Filed Oct. 25, 1967

INVENTOR.

CHARLES H. FA

BY Howard A. Silber

ATTORNEY

1

3,514,676
INSULATED GATE COMPLEMENTARY FIELD EFFECT TRANSISTORS GATE STRUCTURE

Charles H. Fa, Newport Beach, Calif., assignor to North American Rockwell Corporation Filed Oct. 25, 1967, Ser. No. 678,079
Int. Cl. H01l 11/14
U.S. Cl. 317—235 3 Claims

ABSTRACT OF THE DISCLOSURE

Insulated gate field effect devices including a field effect transistor (FET), a tetrode, and complementary FET inverters. Each device comprises a semiconductor layer having diffused source and drain regions separated by a channel region of different conductivity. Beneath the layer and separated therefrom by a thin insulating film, is a region of low resistivity semiconductor having a metallized electrode on its lower surface. The low resistivity semiconductor and the electrode together function as the FET gate. A passivation layer and metallized source and drain connections are provided atop the semiconductor layer. Appropriate process steps are described for fabrication of the device.

BACKGROUND OF THE INVENTION

Field of the invention

The present invention relates to an insulated gate field effect transistor. More particularly, the present invention relates to insulated gate field effect devices in which the gate element comprises a metal electrode and low resistivity semiconductor layer separated from the source, drain, and channel regions of the device by an embedded insulating film.

Description of the prior art

In the fabrication of large scale microelectronic integrated circuits, increased emphasis recently has been placed on utilization of field effect transistors (FET) wherein current flow through a semiconductor channel is controlled by an external voltage applied to a control element called the gate. Such transistors lend themselves to simplicity of fabrication in conjunction with other integrated circuit components.

The progress of prior art metal-oxide-semiconductor (MOS) field effect transistors (FET's) has been hindered by the instability of device characteristics resulting from electrochemical complications within the oxide used as a gate insulator, and at the oxide/semiconductor interface. In addition, such prior art MOS FET devices are incapable of high voltage operations because of electrostatic complications associated with the gate insulator.

In typical prior art field effect transistors, the gate electrode is separated from the channel region by a thin passivation layer, typically of silicon dioxide. This silicon dioxide is subject to various failure mechanisms including inversion and channeling due to contamination in, on, or under this layer. Typically, such silicon dioxide MOS FETs exhibit degeneration of transistor characteristics over the life of the transistor, and suffer inconsistencies in their gate turn-on voltages. The instabilities have been attributed to two primray mechanisms, both associated with the $SiO_2$ gate insulation layers; these include vacancy formation and the presence of moderately mobile impurities (generally sodium) in the $SiO_2$.

Positively charged vacancies in the $SiO_2$ layer may result from reduction of the oxide at the gate-insulator surface. For example, should aluminum be used as the gate material, reaction between the aluminum gate and the underlying $SiO_2$ may result in the formation of

2

$Al_2O_3$ at the interface, with concomitant localized reduction of the $SiO_2$. Since aluminum oxide is a more stable compound than $SiO_2$ iteself, the reaction tends to produce positively charged sites in the silicon dioxide. Further, these vacancies tend to migrate through the oxide layer, resulting in localized regions of decreased dielectric strengths. The process can result in the progressive deterioration of the transistor over its lifetime. Moreover, transistors wherein the $SiO_2$ layer has been grown from water vapor rather than pure oxygen may exhibit different characteristics. The presence of hydroxyl groups or hydrogen ions in the dielectric layer is believed to be responsible for the anamolous behavior of such wet grown FET's.

The second FET failure mechanism apparently results mainly from the presence of sodium ions in the silicon dioxide dielectric layer. Such sodium impurities may be introduced in the diffusion and oxidation processing steps carried out during fabrication of the transistors. For example, a concentration of $5 \times 10^{11}$ sodium ions per square centimeter of $SiO_2$ is not an uncommon sodium concentration in a typical MOS transistor. When the temperature of such a transistor is raised to between 150° to 200° centigrade, these sodium ions begin to flow through the silicon dioxide. Although they essentially are frozen in place when the temperature of the transistor again is reduced to near room temperature, the new positions of the sodium ions may drastically alter the threshold or turn-on voltage of the transistors. This results since the effect of such an ion in changing the threshold voltage is proportional to its distance from the gate-insulator interface. As an example, prior to heating a transistor may exhibit a threshold voltage of say 0.5 volt. After heating to above 150° C. and concomitant relocation of the sodium ions, the recooled transistor may exhibit a new threshold voltage of 2 or 3 volts.

Another limitation of prior art MOS FET devices is their inability to operate at high voltages. In such device, the gate insulation layer must be extremely thin to permit control of the channel current. As a result, a very small accumulated electrostatic charge on the gate easily can exceed the dielectric breakdown voltage of the oxide insulation layer, thus rupturing the device.

These and other limitations of prior art field effect transistors are overcome by providing an insulated gate field effect transistor in which the gate comprises a metal electrode and a layer of low resistivity silicon separated from the source, drain, and channel regions by an embedded insulating film. The inventive field effect transistor exhibits improved stability and higher voltage breakdown characteristics than obtainable with prior art devices.

SUMMARY OF THE INVENTION

In accordance with the present invention, there are provided an insulated gate field effect devices having a poly- or mono-crystalline semiconductor layer containing diffused source and drain regions separated by a channel of conductivity different therefrom. Beneath this semiconductor layer there is provided an insulating film, preferably of silicon nitride, separating the source, drain, and channel regions from a layer of low resistivity bulk semiconductor. A metal electrode is coated on the opposite surface of the low resistivity semiconductor, the electrode and the low resistivity material together functioning as a gate element.

In other embodiments of the present invention, a tetrode structure may be provided by utilizing an additional gate electrode corresponding in position to a conventional FET gate. Complementary FET inverters may be provided by fabricating adjacent NPN and PNP transistors atop a common insulation layer, low resistivity semiconductor region, and metal electrode.

It is thus an object of the present invention to provide an improved field effect transistor.

Yet another object of the present invention is to provide a field effect transistor having an insulated gate.

Another object of the present invention is to provide a field effect transistor in which the gate comprises a metal electrode underlying a layer of low resistivity silicon separated from the channel by an embedded insulating film.

Yet another object of the present invention is to provide an insulated gate field effect transistor having improved stability and voltage breakdown characteristics.

Yet another object of the present invention is to provide an improved technique for the fabrication of insulated gate field effect transistors.

Still another object of the present invention is to provide complementary FET inverters having a common insulated gate electrode.

These and other objects and features of the present invention will become apparent from the following description taken in connection with the accompanying drawings.

DESCRIPTION OF THE PREFERRED EMBODIMENT

Figure 1:
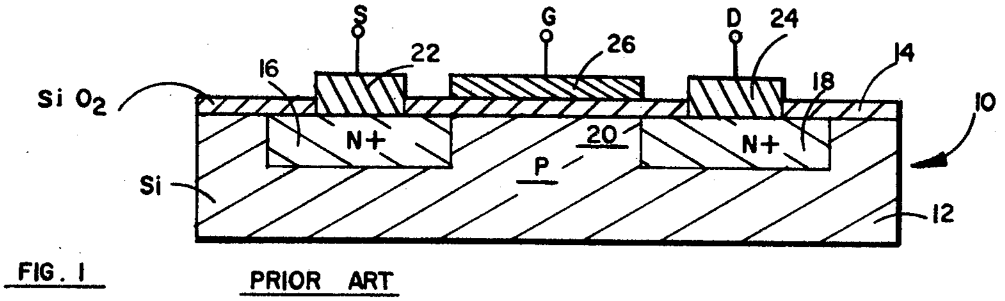
FIG. 1 PRIOR ART
FIG. 1 is a greatly enlarged, sectional view of an enhancement type metal-oxide-semiconductor field effect transistor in accordance with the prior art.

A typical P-channel enhancement mode field effect transistor (FET) in accordance with the prior art is illustrated in FIG. 1. As shown therein, field effect transistor 10 comprises substrate 12 of semiconductor material, typically P-type single crystal silicon. Atop silicon body 12 is passivation layer 14 of silicon dioxide. N+ doped source and drain regions 16 and 18 are formed within silicon body 12 by appropriate diffusion through openings in passivation layer 14. Note that the diffusion is carried out for a controlled period of time so as to leave channel 20 of desired length between source and drain regions 16 and 18. Metallized electrodes 22 and 24, formed by deposition of a metal into the openings in passivation layer 14, provide connections to the source and drain. Metal electrode 26, applied atop passivation layer 14 opposite channel 20, functions as the gate element for FET 10.

As is well known, prior art enhancement mode FET 10 (see FIG. 1) actually consist of two separate diodes, with the gate spanning the region separating them. When an appropriate positive bias is applied to gate 26, electrons are attracted to, and holes are repelled from, this region. If the bias is large enough, the material in this region will actually convert to N type, and the source and drain will be separated only by a very low impedance path. A heavy hole current then flows between the drain and the source, and, if a load resistor is connected between these two elements, a voltage proportional to the gate voltage will appear across it. If an alternating voltage is applied to the gate, an amplified version will appear across the load resistor. This type of transistor is called an enhancement type, because the flow of current between source and drain is enhanced by the gate voltage.

As mentioned earlier, conventional MOS FET's such as that illustrated in FIG. 1 suffer several shortcomings. In particular, such FET's typically exhibit instability of device characteristics under conditions of high electric field and temperature. Although the detailed mechanisms associated with such instability have not been completely explained, it generally is recognized that the problem originates from chemical contamination or ionic movement within oxide passivation layer 14 and at the interface between oxide layer 14 and semiconductor 12. Pinholes through passivation layer 14 and non-homogenity of the oxide forming layer 14 also contribute to this failure mode.

Another limitation of typical MOS FET 10 illustrated in FIG. 1 is its inability to operate at high voltages. To achieve appropriate control of the current through channel 20 in response to the voltage applied to gate 26, passivation layer 14 must be extremely thin. As a result, a very small amount of electrostatic charge accumulated on gate 26 easily can exceed the dielectric breakdown voltage of the oxide of passivation layer 14, thus rupturing the device.

These and other shortcomings of prior art FET 10 (see FIG. 1) may be overcome by using the inventive insulated gate field effect devices which form the subject matter of the present invention.

Figure 2:
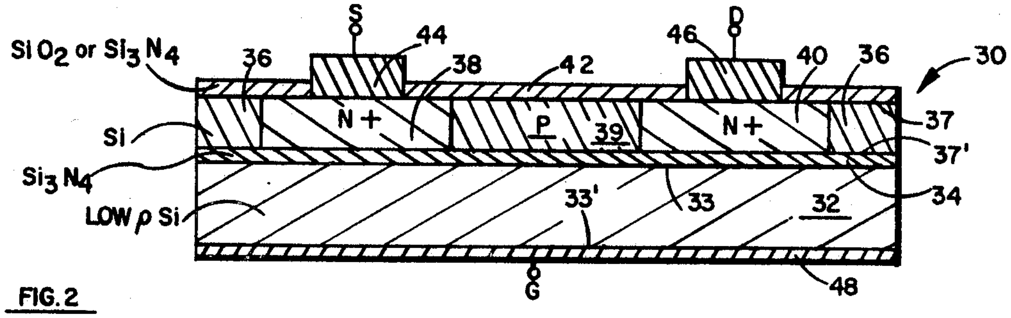
FIG. 2 is a greatly enlarged, sectional view of an insulated gate field effect transistor in accordance with the present invention.

Referring now to FIG. 2, there is shown typical insulated gate field effect transistor 30 in accordance with the present invention. FET 30 comprises region 32 of low resistivity, semiconductor material. Preferably the material of region 32 should have a resistivity $\rho$ of less than 0.1 ohm centimeter. In a typical embodiment, region 32 comprises N-type polycrystalline silicon having a resistivity on the order of 0.01 ohm centimeter and a thickness of approximately 5 mils. Metal film 48 is provided over a substantial portion of lower surface 33' of low resistivity semiconductor region 32; film 48 and region 32 together form the gate electrode for FET 30.

Situated atop upper surface 33 of region 32 is thin film 34 of insulating material, preferably a nitride of the semiconductor of region 32. As illustrated in FIG. 2, film 34 comprises silicon nitride. Film 34 separates flow resistivity semiconductor region 32 from poly- or mono-crystalline layer 36. In the embodiment shown in FIG. 2, region 39 of layer 36 comprises P-type undoped silicon, having a preferred minimum thickness on the order of 2 mils. Diffused within semiconductor layer 36 are source and drain regions 38 and 40 (see FIG. 2) of N-type conductivity.

Provided atop layer 36 is passivation layer 42 comprising an oxide or nitride of the semiconductor of layer 36. Passivation layer 42 is illustrated in FIG. 2 as comprising $SiO_2$ or $Si_3N_4$. Metal electrodes 44 and 46, extending through passivation layer 42, provide electrical contact with source and drain regions 38 and 40 respectively.

Operation of the inventive field effect transistor 30 illustrated in FIG. 2 is substantially the same as that of prior art FET 10 illustrated in FIG. 1. Note, however, that in FET 30 the gate in effect comprises metal electrode 48 and low resistivity semiconductor region 32, which region is embedded beneath insulating film 34. Insulating film 34 itself is embedded within FET 30 and is not exposed to the atmosphere. Hence, insulating film 34 is subject to substantially less contamination than was passivation layer 14 of prior art FET 10. Moreover, since insulating film 48 is not in contact with a metallic electrode, the problem of oxide reduction at an oxide-metal interface (such as at the interface of oxide 14 and gate electrode 26 of prior art FET 10) is eliminated. This results in the invention field effect devices being more stable than prior art FET's.

In addition, metal electrode 48 (see FIG. 2) is substantially separated from film 34 by the thickness of low resistivity region 32. Thus, a substantially higher electrostatic charge must accumulate on electrode 48 to exceed the combined breakdown value of semiconductor region 32 and insulating film 34 than was required to break down passivation layer 14 of prior art FET 10. As a result, the inventive insulated gate field effect transistor 30 shown in FIG. 2 has significantly higher breakdown voltage than that of prior art FET's.

If layer 36 is to comprise a polycrystalline semiconductor, the inventive field effect device of FIG. 2 may be constructed in the following exemplary manner. Begin with a low cost, N-type silicon wafer of approximately 5 mils thickness and 0.01 ohm centimeter resistivity; this starting material will form region 32. Insulating film 34 is deposited atop surface 33 of silicon region 32 by placing the wafer in a vapor deposition chamber and depositing thereon silicon nitride formed by decomposition of anhydrous ammonia. Typically, silicon nitride film 34 may have a thickness on the order of 1500 A.

Next polycrystalline silicon layer 36 is deposited atop nitride film 34 by hydrogen reduction of silicon tetrachloride or silane, a technique well known to those skilled in the microelectronic art. As an example, silicon layer 36 may have a thickness on the order of 1 to 2 mils. Insulating film 42 is prepared atop upper surface 37 of layer 36 utilizing decomposition of anhydrous ammonia if silicon nitride is desired, or thermal oxidation of silicon layer 36 to provide silicon dioxide. A thickness of 1500 A. is typical for film 42.

Diffused source and drain regions 38 and 40 are formed using conventional techniques. For example, $SiO_2$ insulating film 42 is coated with a photoresist, the photoresist exposed through an appropriate mask, and the $SiO_2$ preferentially etched away to form openings through film 42. Appropriate N-type impurities are diffused through the openings to form regions 38 and 40. Subsequently, metal electrodes 44 and 46 are deposited by vapor deposition through the openings to form the source and drain contacts. Should silicon nitride be used for film 42, a silicon dioxide film, pyrolytically deposited atop the silicon nitride, may be used as a mask for HF etching of the $Si_3N_4$.

Finally, metal layer 48 may be vacuum deposited onto bottom surface 33' of silicon region 32 to complete fabrication of inventive FET device 30.

In an alternative embodiment, a single crystal semiconductor may be desired for layer 36 of WET 30 (see FIG. 2). The process steps for fabricating such a structure are slightly different from those described immediately hereinabove. Rather, fabrication begins with a single crystal wafer, e.g., of silicon, having a minimum thickness on the order of 1 or 2 mils and a resistivity on the order of several ohm centimeters; this wafer forms semiconductor layer 36. As a first step, silicon nitride is deposited onto surface 37' of layer 36 to form insulating film 34. Again deposition of nitride film 34 may be accomplished by placing single crystal silicon layer 36 in a heated deposition chamber and introducing therein decomposed anhydrous ammonia. Note that prior to the deposition of film 34 the thickness of single crystal layer 36 may be reduced to the desired thickness by appropriate etching with HCl vapor in the deposition chamber.

Subsequent to the deposition of film 34, polycrystalline layer 32 of silicon is deposited onto film 34, for example, utilizing hydrogen reduction of silicon tetrachloride or silane. In a preferred embodiment, the thickness of layer 32 may be on the order of several mils. Next, insulating film 42 of silicon nitride or silicon dioxide may be deposited on surface 37 in the manner described hereinabove and diffusion regions 38 and 40, and electrodes 44 and 46 formed by conventional techniques. Finally, metal electrode 48 may be vapor deposited onto surface 33' to complete the device.

Figure 3:
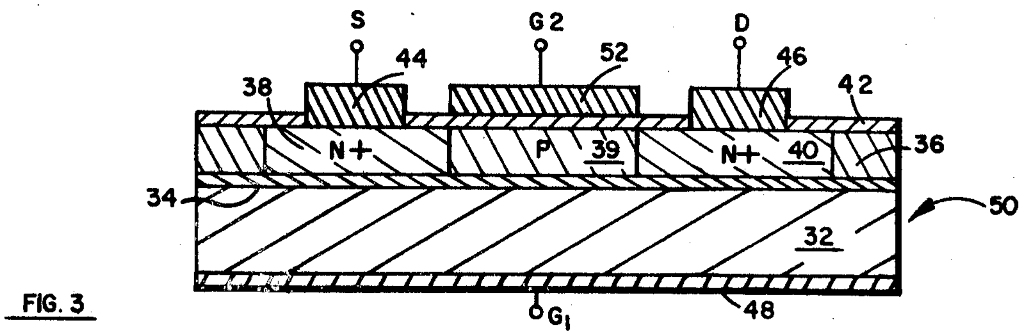
FIG. 3 is a greatly enlarged, sectional view of an insulated gate field effect tetrode in accordance with the present invention.

A tetrode field effect device 50 in accordance with the present invention is illustrated in FIG. 3. Tetrode 50 may be constructed utilizing the process steps corresponding to those set forth for the fabrication of field effect transistor 30 (see FIG. 2). However, a second gate electrode 52 now is provided, as by metal vaporization, atop film 42 opposite channel 39. Inventive tetrode structure 50 is very useful in special purpose microelectronic circuits, as current flow between source 58 and drain 40 may be controlled by insulated gate $G_1$ (via electrode 48) and/or by gate $G_2$ (via electrode 52).

A pair of inventive insulated gate field effect transistors of opposite polarity may be combined to form complementary FET inverters. Such a structure 60 is illustrated in FIG. 4.

Figure 4:
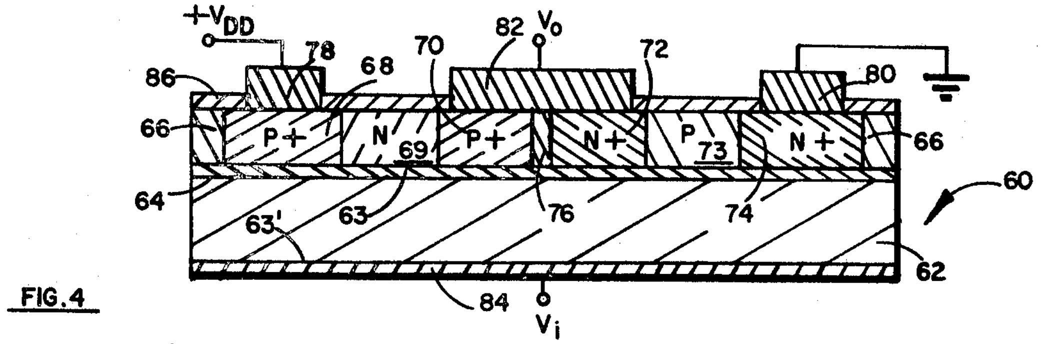
FIG. 4 is a greatly enlarged, sectional view of complementary FET inverters having a common insulated gate, in accordance with the present invention.

Referring now to FIG. 4, it may be seen that complementary FET inverters 60 are fabricated on common, low resistivity semiconductor region 62, lower surface 63' of which is provided with metallized electrode 84. Region 62 and electrode 84 together provide the gate for both complementary transistors of device 60. Atop surface 63 of region 62 there is provided insulating film 64, preferably of silicon nitride. Layer 66, disposed atop insulating film 64, comprises either poly- or mono-crystalline semiconductor material, typically silicon.

Still referring to FIG. 4, note that a first transistor formed within semiconductor layer 66 comprises P+ source and drain regions 68 and 70 separated by N-type channel 69. A second transistor formed within layer 66 comprises N+ source and drain regions 72 and 74 separated by P-type channel 73. Metal electrodes 78 and 80 provide electrical connections to source 68 and drain 74 respectively, while metal electrode 82 provides common electrical contact to both drain 70 and source 72.

The inventive device 60 illustrated in FIG. 4 may be fabricated in a manner not unlike that of inventive FET 30 (shown in FIG. 2). After fabrication of layers 62, 64, 66 and 84 (in a manner analogous to construction of corresponding layers 32, 34, 36 and 48 of device 30 illustrated in FIG. 2), a mask is provided over that portion of initially P-type semiconductor region 66 (illustrated on the right hand side of FIG. 4) in which the NPN transistor is to be fabricated. The remaining portion of region 66 (illustrated in FIG. 4 on the left hand side) then is subject to a diffusion of N-type dopant, thereby forming the substrate for the PNP transistor. Subsequent to this initial diffusion, film 86 of insulating material such as $SiO_2$ or $Si_3N_4$ is provided over the entire upper surface of region 66.

Next, two openings are provided above the locations in which source and drain regions 72 and 74 are desired, and an appropriate N-type dopant diffused through the openings into the portion of semiconductor 66 which initially was P-type. Either simultaneously or subsequently, a second pair of diffusion openings are provided through film 86, through which P+ impurities are diffused to form source and drain regions 68 and 70 within the portion of semiconductor material 66 which previously had been converted to N-type. Finally, metallized electrodes 78, 80 and 82 are provided. As noted, electrodes 78 and 80 make contact with respective source and drain regions 68 and 74, while metallized electrode 82 serves as the common contact for drain 70 and source 72.

The operation of complementary FET inverters 60 illustrated in FIG. 4 is substantially analogous to the operation of independent PNP and NPN transistors interconnected in accordance with the schematic diagram of FIG. 4, wherein PNP transistor **60*a* includes source 68, drain 70 and channel 69 (see FIG. 4) and wherein NPN transistor 60*b* includes source 72, drain 74 and channel 73 of device 60. As may be seen in FIG. 5, the source of PNP transistor 60*a* is connected to a bias voltage designated $V_{DD}$. An input signal $V_i$ is provided to the common gate electrode 84 and operates to symmetrically control the flow of current in transistors 60*a* and 60*b*. The output $V_o$ is obtained via common electrode 82 which contacts both the drain of transistor 60***a* and the source of transistor 60*b*. The drain of NPN transistor 60*b* is connected to ground.

Figure 5:
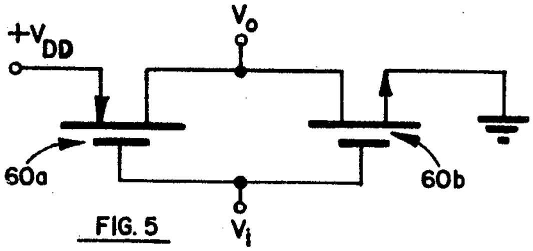
FIG. 5 is an electrical schematic diagram of a typical circuit in which the inventive insulated gate complementary FET inverters of FIG. 4 may be utilized.

The inverters illustrated in FIGS. 4 and 5 are extremely useful in various circuits, such as those described on page 189 of the article by J. T. Wallmark entitled "The Field Effect Transistor," I.E.E.F. Spectrum, March 1964.

While the above examples have been set forth in terms of a silicon low resistivity region, a silicon nitride embedded insulator, and silicon active regions, it will be understood that the invention is not so limited, and that other semiconductor and insulator materials also may be utilized in the inventive insulated gate field effect devices described in the present application.

Although the invention has been described and illustrated in detail, it is to be understood that the same is by way of illustration and example only, and is not to be taken by way of limitation; the spirit and scope of this invention being limited only by the terms of the appended claims.

I claim:

1. An insulated gate field effect transistor, comprising:

a body of semiconductive material of a first conductivity type, which body includes source and drain regions of semiconductive material of a second conductivity type;

a first film of insulating material, one surface thereof being attached to one surface of said body;

a film of semiconductive material, one surface thereof being attached to another surface of the first film of insulating material so that the film of insulating material is embedded between the film of semiconductive material and said body;

a film of metallic material, one surface thereof being attached to another surface of the film of semiconductive material, the films of semiconductive and metallic materials comprising a gate member of said transistor;

a second film of insulating material, one surface thereof being attached to another surface of said body, said source and drain regions of semiconductive material extending completely between said first and second films of insulating material;

metallic electrodes attached to each of the source and drain regions of semiconductive material; and a metallic electrode attached to another surface of said second film of insulating material.

2. The transistor as defined in claim 1, wherein:

the material of said first and second conductivity types is selected from the group consisting of polycrystalline silicon or monocrystalline silicon; and the film of semiconductive material is of polycrystalline silicon.

3. A complementary insulated gate field affect transistor, comprising:

a body of semiconductive material having a first portion of semiconductive material of a first conductivity type and a second portion of semiconductive material of a second conductivity type said first portion including source and drain regions of semiconductive material of a type opposite in conductivity to that of the first conductivity type, said second portion including source and drain regions of semiconductive material of a type opposite in conductivity to that of the second conductivity type, thereby providing adjacent source and drain regions of different conductivity types which are spaced apart from each other;

a first film of insulating material, one surface thereof being attached to one surface of said body;

a film of semiconductive material, one surface thereof being attached to another surface of the first film of insulating material so that the first film of insulating material is embedded between the film of semiconductive material and said body;

a film of metallic material, one surface thereof being attached to another surface of the film of semiconductive material, the films of semiconductive and metallic materials comprising a gate member of said transistor;

a second film of insulating material, one surface thereof being attached to another surface of said body, all said source and drain regions of semiconductive material extending completely between said first and second films of insulating materials;

a first metallic electrode attached to and bridging the adjacent source and drain regions; and metallic electrodes, one each attached to the source and drain regions other than those regions to which said first metallic electrode is attached.

References Cited

UNITED STATES PATENTS

| | | | |
|---|---|---|---|
| 3,385,729 | 5/1968 | Larchian | 117—200 |
| 3,390,022 | 6/1968 | Fa | 148—33 |
| 3,419,761 | 12/1968 | Pennebaker | 317—234 |

OTHER REFERENCES

Zuleeg et al., Proceedings of the I.E.E.E., September 1966, pp. 1197–1198 relied on.

Lehman et al., IBM Technical Disclosure Bulletin, vol. 8, No. 4, September 1965, p. 675.

JOHN W. HUCKERT, Primary Examiner

M. H. EDLOW, Assistant Examiner

U.S. Cl. X.R.

148—33